United States Patent
Yonehara et al.

(10) Patent No.: US 6,613,676 B1
(45) Date of Patent: Sep. 2, 2003

(54) PROCESS OF RECLAMATION OF SOI SUBSTRATE AND REPRODUCED SUBSTRATE

(75) Inventors: Takao Yonehara, Atsugi (JP); Masataka Ito, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/238,500

(22) Filed: Jan. 27, 1999

(30) Foreign Application Priority Data

Jan. 30, 1998 (JP) .......................................... 10-018811

(51) Int. Cl.⁷ .............................................. H01L 21/302
(52) U.S. Cl. ...................... 438/691; 438/455; 438/692; 438/693; 438/745
(58) Field of Search .................................. 438/691, 692, 438/697, 745, 750, 459, 471, 977, 455; 156/345, 345.1

(56) References Cited

U.S. PATENT DOCUMENTS

| | | | |
|---|---|---|---|
| 3,559,281 A | * 2/1971 | Mayberry et al. | 29/575 |
| 5,131,979 A | * 7/1992 | Lawrence | 156/345 |
| 5,371,037 A | 12/1994 | Yonehara | 437/86 |
| 5,374,564 A | 12/1994 | Bruel | 437/966 |
| 5,405,802 A | * 4/1995 | Yamagata et al. | 438/459 |
| 5,458,755 A | 10/1995 | Fujiyama et al. | 204/224 |
| 5,622,875 A | 4/1997 | Lawrence | 438/691 |
| 5,783,022 A | 7/1998 | Cha et al. | 156/344 |
| 5,855,735 A | * 1/1999 | Takada et al. | 156/636.1 |
| 5,869,387 A | 2/1999 | Sato et al. | 438/459 |
| 5,882,987 A | * 3/1999 | Srikrishnan | 438/458 |
| 5,920,764 A | * 7/1999 | Hanson et al. | 438/4 |
| 5,931,662 A | * 8/1999 | Adachi et al. | 432/6 |
| 5,937,312 A | * 8/1999 | Iyer et al. | 438/459 |
| 5,953,622 A | * 9/1999 | Lee et al. | 438/458 |
| 6,051,477 A | * 4/2000 | Nam | 438/404 |
| 6,107,213 A | * 8/2000 | Tayanaka | 438/762 |
| 6,255,159 B1 | * 7/2001 | Thakur | 438/253 |

FOREIGN PATENT DOCUMENTS

| | | |
|---|---|---|
| EP | 0793263 | 9/1997 |
| EP | 0 793 263 A2 | 9/1997 |
| JP | 7-122532 | 5/1955 |
| JP | 5-211128 | 8/1993 |
| JP | 7-302889 | 11/1995 |
| JP | 9-237771 | 9/1997 |

OTHER PUBLICATIONS

Stanley Wolf, Silicon processing for the VSLI era, vol. 1, pp 532, 1986.*
G.W. Cullen, "Single–Crystal Silicon on Non–Single–Crystal Insulators", Journal of Crystal Growth, vol. 63, No. 3, Oct. 11, 1983.
Abstract of U.S. Patent 5,131,979.

* cited by examiner

*Primary Examiner*—Robert Kunemund
*Assistant Examiner*—Lan Vinh
(74) *Attorney, Agent, or Firm*—Fitzpatrick, Cella, Harper & Scinto

(57) ABSTRACT

An SOI substrate 1 having semiconductor base plate 2 and a single crystal semiconductor layer 4 with interposition of an insulating layer 3 is prepared is reclaimed through a first removal step of removing the single crystal semiconductor layer 4, and a second removal step of removing selectively the insulation layer 3. Thereby the loss of the thickness of the base plate in the reclamation is decreased in the reproduction of the SOI substrate.

4 Claims, 8 Drawing Sheets

PROCESS OF RECLAMATION OF SOI SUBSTRATE AND REPRODUCED SUBSTRATE

BACKGROUND OF THE INVENTION

1. Field of the Invention

The present invention relates to a semiconductor substrate, and to a process for production thereof. Especially the present invention relates to a substrate used for production of electronic devices, integrated circuits, and the like, and a process for production of the substrate.

More specifically, the present invention relates to a reusable reclaimed substrate which is reclaimed by working a substrate having a single crystal semiconductor layer provided on an insulating layer, and to a process for reclamation thereof.

2. Related Background Art

In a semiconductor production process, a large number of wafers are used as test wafers for monitoring film thickness in production steps and for monitoring particles, and dummy wafers in heating apparatuses. Defective wafers are unavoidably formed in the production steps and are rejected in the final inspection step.

Bulk wafers are reclaimed and reused usually for effective utilization of resources and for cost reduction of the semiconductor production. In the reclamation process, a film such as polysilicon films for LSI, insulation films, and aluminum films formed on the surface of the wafer is eliminated by etching or lapping, polishing or grinding. The mechanical elimination such as lapping is conducted to eliminate a hard film not eliminable by etching only or a complicated film (multiple layer).

As mentioned above, bulk silicon wafers having used as a process wafer, test wafers, dummy wafers, or the like are conventionally reclaimed. The process for the reclamation is described typically in Japanese Patent Application Laid-Open Nos. 9-237771 and 7122532.

On the other hand, substrates having a single crystal semiconductor layer on an insulation layer (hereinafter referred to as an "SOI substrate") which are produced by processing of a silicon bulk wafer through various steps are not reclaimed. Defective SOI substrates after the production, which do not meet the quality standard such as uniformity of film thickness, stacking fault density, particles, and so forth are rejected and discarded.

However, reclamation of the defective SOI substrates are demanded for repeated use in the SOI substrate production, or for wafers of other semiconductor substrates from the standpoint of cost reduction in production of SOI substrates.

The formation of single crystal Si semiconductor layer on an insulator, namely SOI substrate formation, is widely known as silicon-on-insulator (SOI) technique. The device utilizing the SOI technique has many advantages which cannot be achieved by an ordinary bulk Si substrate for Si integrated circuit, as shown below.

1. Ease of dielectric isolation and possibility for high integration,
2. High resistance against radioactive ray,
3. Low floating capacity and possibility for high speed operation,
4. Needlessness of the welling process,
5. Preventableness of latch-up, and
6. Possibility for formation of a complete depletion type of field effect transistor by thinner film formation.

These matters are described in detail in the literature: Special Issue, "Single Crystal Silicon on Non-Single-Crystal Insulators", edited by G. W. Cullen, Journal of Crystal Growth, vol. 63, no. 3, pp. 429–590 (1983).

The SOI structure can be formed by a process including typically an oxygen ion implantation process, and a bonding process.

The oxygen ion implantation process, called SIMOX, was firstly reported by K. Izumi. In this process, oxygen ions are implanted into an Si wafer at a density of $10^{17}$ to $10^{18}/cm^2$, and thereafter, it is annealed in an argon-oxygen atmosphere at a high temperature of about 1320° C. Consequently, Si oxide layer is formed by bonding of the implanted oxygen ions to Si around the depth corresponding to the projection range (Rp) of ion implantation. Simultaneously, above the Si oxide layer, the Si layer having turned amorphous by the oxygen ion implantation crystallizes again to change into a single crystal Si layer. Thus the SOI substrate is produced.

On the other hand, one of the bonding processes for semiconductor substrate is disclosed by Takao YONEHARA, one of the inventors of the present invention, in Japanese Patent 2,608,351 and U.S. Pat. No. 5,371,037. In this process, an SOI substrate is produced through steps of preparing a first member having a porous single crystal semiconductor layer and a nonporous single crystal semiconductor layer; bonding the above first member to a second member with interposition of an insulating layer and with the above nonporous single crystal semiconductor layer placed inside; and removing the porous single crystal semiconductor layer.

Another method of producing an SOI substrate is disclosed in Japanese Patent Application Laid-Open No. 5-211128 in which a micro-bubble layer (separation layer) is formed in a silicon base plate (first base plate) by ion implantation, the first base plate is bonded to a second base plate, the bonded article is heat-treated to cause rearrangement of crystals and coalescence of the bubbles in the bubble layer, and thereby the outermost layer (called "thin semiconductor material film" in this laid-open patent) is separated at the micro-bubble layer to produce an SOI substrate. The above ion implantation is conducted with rare gas ions or hydrogen ions.

In preparation of SOI substrates by the bonding methods, the first substrate having a separation layer becomes useless after separation of the SOI structure. Yonehara, one of the inventors of the present invention, et al. disclosed a method of reusing the separated first base plate in production of a semiconductor substrate in Japanese Patent Application Laid-Open No. 7-302889.

An example of the method disclosed in the above laid-open patent publication is explained below by reference to FIGS. 10A, 10B, and 10C. A surface layer of first Si base plate 1001 is made porous to form porous layer 1002. On porous layer 1002, single crystal Si layer 1003 is formed. This single crystal Si layer 1003 is bonded to the main face of second Si base plate 1004 with interposition of insulating layer 1005 (FIG. 10A). Then the bonded wafer is separated at the porous layer (FIG. 10B). The bared porous Si layer on the surface of the second Si base plate is removed selectively to obtain an SOI substrate (FIG. 10C). The separated first Si base plate 1001 can be reused after removal of the remaining porous layer.

According to the above method, the separated first Si base plate 1001 is reusable. On the other hand, an SOI structure formed on the second Si base plate may be defective or may not meet the quality standard of film thickness distribution or particles, and so forth. In this case, the second base plate, or the SOI substrate also needs to be reclaimed. The reclamation of both the first Si base plate and the second Si base plate, if it is possible, further cost reduction can be achieved in production of SOI substrates.

In recent several-years, many reports have been presented regarding the usefulness of the SOI structure for higher speed and lower power consumption of MOSFET (IEEE SOI Conference 1994). With the SOI structure, the insulation layer under the element enables simplification of element separation process in comparison with the element formed on a bulk Si wafer, whereby the device production process can be simplified. Therefore, the SOI substrate not only improve the performance of the device, but also reduces the wafer cost and the processing cost in total. Because of the above advantages, production of SOI substrates is expected to grow more, and the reclamation of the SOI substrate will be the important problem.

SUMMARY OF THE INVENTION

The present invention intends to provide a process for reclaiming an SOI substrate.

The present invention intends also to decrease the loss of thickness of the base plate in the reclamation process and to decrease the variation of the thickness of the base plate over the surface.

The present invention further intends to provide a method of flattening of the surface of the silicon base plate after removal of the insulation layer.

The first embodiment of the present invention is a process for reclaiming an SOI substrate, comprising a step of providing an SOI substrate having a semiconductor base plate, and a single crystal semiconductor layer formed thereon with interposition of an insulation layer; a first removal step for removing the single crystal semiconductor layer; and a second removal step for removing the insulation layer selectively.

The second embodiment of the present invention is a process for reclaiming an SOI substrate, comprising a step of preparing an SOI substrate having a single crystal semiconductor layer on a semiconductor base plate with interposition of an insulation layer, a first removal step of removing the single crystal semiconductor layer by etching or polishing, and a second removal step of removing the insulation layer by etching selectively.

The third embodiment of the present invention is a process for reclaiming an SOI substrate, comprising oxidizing the single crystal semiconductor layer before the above first removal step.

The fourth embodiment of the present invention is a process for reclaiming an SOI substrate, comprising heat-treating the bared semiconductor base plate, after the above second removal step, in a reductive atmosphere containing hydrogen.

The fifth embodiment of the present invention is a process for reclaiming an SOI substrate, comprising polishing chemically and mechanically the surface of the bared semiconductor base plate after the above second removal step.

The sixth embodiment of the present invention is a process for reclaiming an SOI substrate, where the SOI substrate is prepared by a bonding method.

The seventh embodiment of the present invention is a process for reclaiming an SOI substrate, where the SOI substrate is prepared by a bonding method, and the interface between the semiconductor base plate and the insulation layer is the bonding face.

According to the present invention, the SOI substrate can be reclaimed for repeated use in the semiconductor production process. The SOI substrate can be reclaimed repeatedly with little loss of the thickness of the base plate of the SOI substrate. Therefore the reclaimed base plate can be reused for the uses in which the thickness of the base plate is limited. Therefore, the present invention is valuable from the standpoint of industrial production, resource saving, and environmental protection.

The reclaimed SOI substrate of the present invention has surface as flat as that of a bulk wafer, and is useful not only a test wafer or a dummy wafer, but also as a wafer for production of an SOI substrate repeatedly.

DESCRIPTION OF THE PREFERRED EMBODIMENTS

The process for reclamation of an SOI substrate of the present invention is described below in detail.

Generally, the term "SOI substrate" means a substrate having a single crystal silicon layer on an insulation layer. In the present invention, however, the SOI substrate is not limited to the above one, but includes substrates having a single crystal semiconductor layer on an insulation layer.

Figure 1:
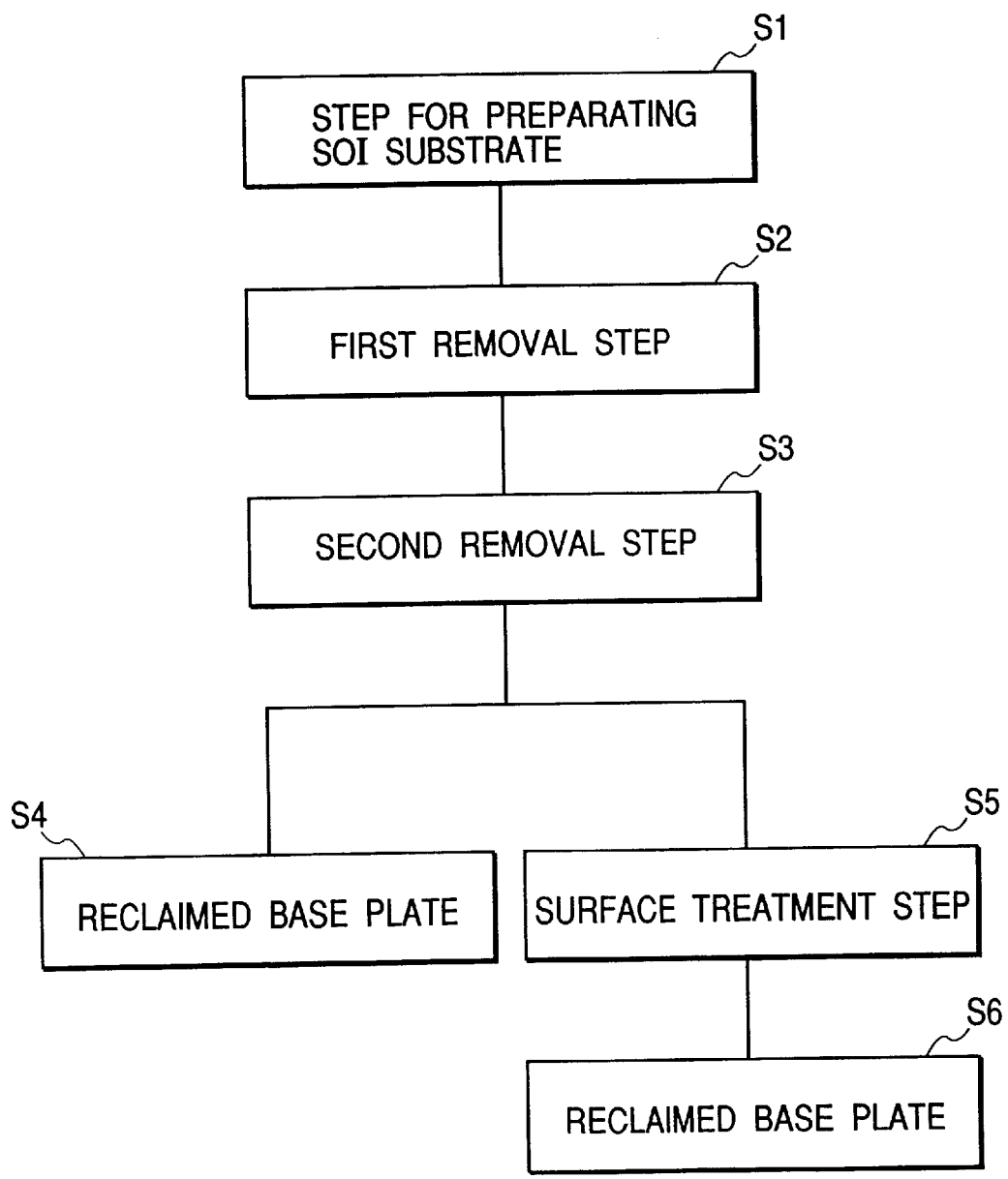
FIG. 1 is a flow chart showing the process of reclamation of an SOI substrate according to the present invention.

The feature of the process of the present invention is described by reference to the flow chart shown in FIG. 1. Firstly, an SOI substrate to be reclaimed is provided (S1). Secondly, treatment of a first removal step is conducted to remove a single crystal semiconductor layer on the insulation layer (S2). Thirdly, treatment of a second removal step is conducted to remove selectively an insulation layer (S3).

Thus a reclaimed base plate is obtained (S4). When the surface of the reclaimed base plate after the second removal step is required to have higher flatness or smoothness, or decreased micro-roughness, a surface treatment (S5) is conducted after the second removal step (S3) to obtain a treated reclaimed base plate (S6).

Figure 2A:
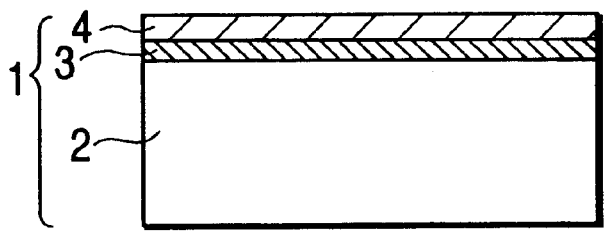
FIGS. 2A, 2B, 2C, and 2D are schematic sectional views illustrating steps for reclaiming an SOI substrate according to the process for SOI substrate reclamation of the present invention.
Figure 2B:
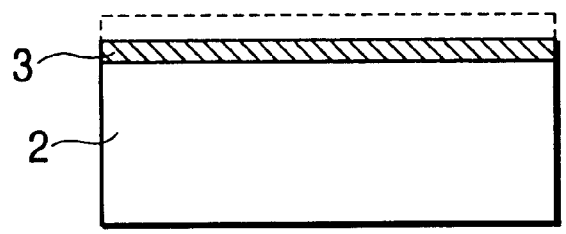
Figure 2C:
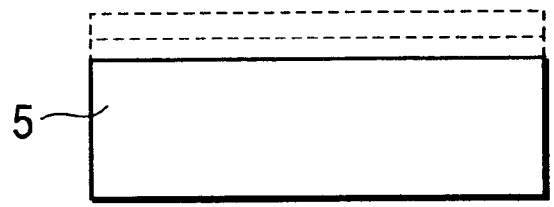
Figure 2D:
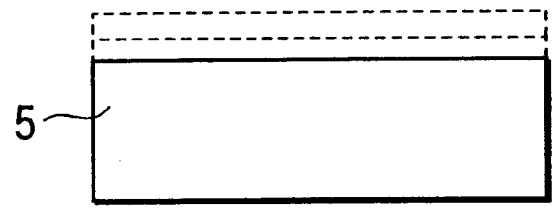

The steps shown in the above flow chart (FIG. 1) is described specifically by reference to schematic sectional views of an SOI substrate. SOI substrate 1 is provided which has single crystal semiconductor layer 4 on semiconductor base plate 2 with interposition of insulation layer 3 (FIG. 2A). Such an SOI substrate to be treated in these steps, for example, is the one produced by the-process mentioned above, but has low quality, not meeting the requirements for the characteristics of the single crystal semiconductor layer. Single crystal semiconductor layer 4 is removed by the first removal step (FIG. 2B). Then insulation layer 3 is selectively removed by the second removal step (FIG. 2C) to prepare reclaimed base plate 5. When the reclaimed base plate is required to have higher flatness or smoothness of the surface, or decreased surface roughness (micro-roughness) of the surface, a surface treatment is conducted to obtained treated reclaimed base plate 5 (FIG. 2D).

Semiconductor base plate 2 in the present invention include silicon plates, single crystal silicon plates, polycrystal silicon plates, Ge plates, GaAs plates, and InP plates.

Insulation layer 3 in the present invention includes silicon oxide layers, silicon nitride oxide layers, and silicon nitride layers, and combination thereof.

Single crystal semiconductor layer 4 is comprised of a material including Si, Ge, SiGe, SiC, C, GaAs, AlGaAs, AlGaSb, InGaAs, InP, InAs, ZnS, CdSe, and CdTe. The layer may be a single layer of the above substance, or lamination of the above layers.

In the first removal step, single crystal semiconductor layer 4 can be removed by etching or polishing. In the removal by etching, the etching method is not limited, but a method is preferred in which single crystal semiconductor layer 4 is etched at a higher rate than that of the underlying insulation layer 3. The etching method includes wet etching, gas-phase etching, and plasma-etching.

When a single crystal silicon layer as single crystal semiconductor layer 4 is etched by wet etching, the etchant therefor includes TMAH (tetramethylammonium hydroxide), KOH, and trimethyl-2-hydroxyethylammonium hydroxide. When it is etched by plasma, the etching method include RIE (reactive ion etching) employing $CF_4$—$O_2$ plasma.

When a GaAs layer as single crystal semiconductor layer 4 is etched by wet etching, the etchant therefor includes $Br_2/CH_3OH$ (bromine/methanol mixture), and $NH_4OH/H_2O_2/H_2O$ (ammonia/hydrogen peroxide/water mixture).

The polishing in the first removal step can be conducted by mechanical polishing, chemical polishing, chemical-mechanical polishing (CMP), or electrolytic polishing. Of these polishing processes, CMP process is preferred for the greater smoothness and flatness of the layer surface, and the less distortion by polishing.

In the CMP process, a silicon layer as single srystal semiconductor layer 4 is polished preferably by a mirror-polishing process usually employed in silicon wafer production. This mirror-polishing process is described, for example, in a book, "Sirikon no Kagaku (Science of Silicon) ", pp 247–248, and 294–295, published by Riaraizu K. K. (1996). Specifically, the polishing agent employed is an abrasion grain dispersion composed of a mixture of a fine abrasion grain powder like fine powdery silicon oxide (0.05 to 0.24 µm) and a solution of an alkali such as sodium hydroxide and potassium hydroxide. SOI substrate 1 is fixed at the back face by a wax onto a glass plate, a ceramic plate or the like. This plate is placed with the bonded SOI face directed downward on a level block having a polishing cloth sheet bonded thereon. The plate and the level block are rotated relatively with application of a load between the plate and the level block with feeding the abrasion grain dispersion at a prescribed rate to conduct CMP process. In this process, presumably, a hydrated soft silica film is formed by the alkali solution on the wafer, and the hydrated film is removed by the abrasion grain dispersion. This polishing process utilizes combination of a chemical action and a mechanical action. For example, in polishing of SOI substrate having a silicon layer formed on a silicon oxide layer, a foreign matter which is not removable chemically (e.g., a residue formed in SOI production) can be removed mechanically. Since the rate of polishing of silicon oxide is extremely low, the polishing is considered to stop automatically, practically to remove selectively the silicon layer.

The abrasion agent includes fine particles (size of several to hundred and several tens nanometers) of colloidal silica, calcined silica, or the like dispersed in an alkali solution (pH 9 to 13). An amine type additive may be added thereto for increasing the polishing speed, or an organic polymer type additive may be added thereto for decreasing the surface roughness.

The aforementioned second removal step is conducted by an etching method capable of removing selectively insulation layer 3. Silicon oxide as insulation layer 3 can be etched by hydrofluoric acid, or a buffered hydrofluoric acid (BHF). BHF etches the silicon oxide layer at an etching rate of 100 to 250 nm/min, but etches little the silicon base plate. The etching may be conducted either by liquid-phase etching employing an aqueous hydrofluoric acid solution or the like, or by vapor-phase etching employing vapor of hydrofluoric acid. Silicon nitride as insulation layer 3 can be etched by BHF or $H_3PO_4$ (phosphoric acid).

According to the present invention, since insulation layer 3 as the outermost layer of semiconductor substrate 2 is removed by etching, reclaimed semiconsuctor base plate 5 has defects such as distortion and crystal dislocation less than the defects which will be caused by mechanical removal.

When greater flatness or smoothness, or decrease of micro-roughness of the bared surface of the semiconductor base plate is required after removal of single crystal semiconductor layer 4 and insulation layer 3, the surface treatment may be conducted by heat treatment or surface polishing, or combination thereof. The heat treatment includes hydrogen annealing at an elevated temperature in a reductive atmosphere containing hydrogen. The hydrogen annealing can flatten the surface with less loss of the thickness of semiconductor base plate 2. The hydrogen annealing is preferred for treatment of silicon base plate as semiconductor base plate 2, since the hydrogen annealing allows impurities such as boron to diffuse out of the silicon plate surface layer to lower the impurity concentration simultaneously with the surface flattening.

The temperature of the hydrogen annealing of silicon base plate as the semiconductor base plate is preferably not lower than 300° C. and not higher than the melting point of silicon, more preferably from 500 to 1200° C. The temperature of the hydrogen annealing of the base plate other silicon is preferably not lower than 300° C. and not higher than the melting point of the constituting substance.

The pressure of the reductive atmosphere for the hydrogen annealing may be a higher pressure, an atmospheric pressure, or a reduced pressure, but is preferably not higher than the atmospheric pressure but is not lower than $3.9 \times 10^{-4}$ Pa, more preferably not higher than the atmospheric pressure but is not lower than 1.3 Pa.

The time length of the hydrogen annealing depends on the required properties, and is not limited. Practically, the time ranges from about 1 minute to about 10 hours.

The gas for the hydrogen-containing reductive atmosphere may be pure hydrogen gas or a mixture of hydrogen and an inert gas such as a gas mixture of hydrogen and nitrogen.

Naturally, the hydrogen annealing is applicable, for flattening of the surface, not only in reclamation of SOI substrates but also to any semiconductor base plate, particularly silicon base plates from which its surface insulation layer has been removed.

The surface polishing as the surface treatment can be conducted by CMP process. As the CMP process, a touch polish treatment is preferred in which the amount of abrasion is minimized. The amount of the abrasion preferably does not exceed 1 $\mu$m, more preferably in the range from several to several and tens nanometers. The touch polish can be conducted in the CMP process by decreasing the load applied between the plate and the level block.

In reclamation of the SOI substrate, single crystal semiconductor layer 4 on insulation layer 3 may be oxidized into an insulation film, and may be removed together with insulation layer 3. In particular, when insulation layer 3 is an oxidized silicon layer, the single crystal silicon layer is changed by oxidation into the same substance as the insulation layer. Thus the single crystal semiconductor layer and the insulation layer can effectively be removed simultaneously in one etching step.

Naturally, any SOI substrate prepared by other method than the oxygen ion implantation, and the bonding method as mentioned above may be reclaimed according to the present invention.

Figure 3A:
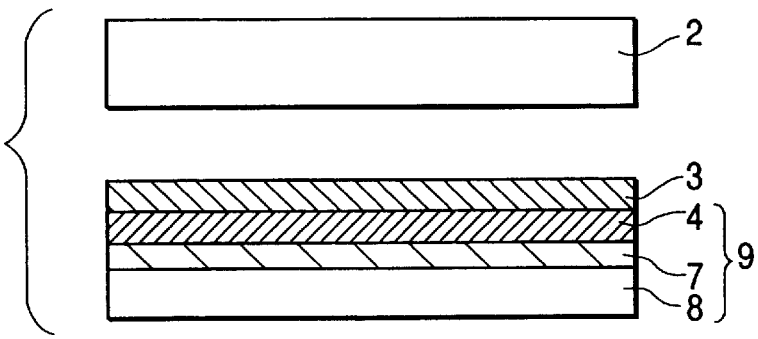
FIGS. 3A, 3B, and 3C are schematic sectional views illustrating the steps of preparing an SOI substrate by a bonding method.
Figure 3B:
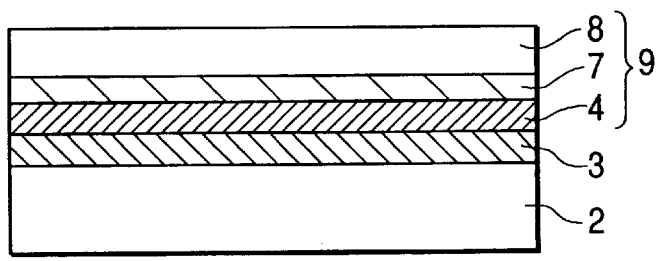
Figure 3C:
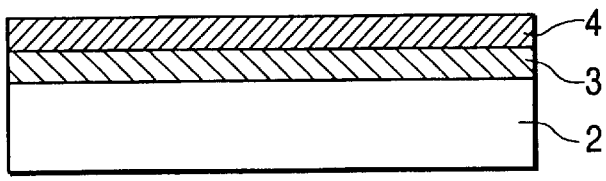

The bonding method for preparation of the SOI substrate is conducted specifically, as shown in FIGS. 3A, 3B, and 3C, through the steps comprising providing first base plate 9 having single crystal semiconductor layer 4 and insulation layer 3 on separation layer 7, bonding single crystal semiconductor layer 4 to second semiconductor base plate 2 with interposition of insulation layer 3 to form a multiple layer structure (FIG. 3B), and separating the multiple layer structure at the separation layer or removing the separation layer to obtain an SOI substrate having the second semiconductor base plate and a single crystal semiconductor layer bonded thereto with interposition of an insulation layer (FIG. 3C). In FIGS. 3A to 3C, the numeral 8 indicates a supporting base plate.

In FIG. 3A, an embodiment that insulation layer 3 is formed on single crystal semiconductor layer 4 of first base plate 9 is schematically shown. Otherwise, insulation layer 3 may be formed on second semiconductor base plate 2, or formed on the both base plates respectively. It is a matter of cause that first base plate 9 may be bonded to second semiconductor base plate 2 with interposition of insulation layer 3.

Insulation layer 3 may be formed on first base plate 9 before separation layer 7 is formed on first base plate 9.

Separation layer 7 may be formed in a porous state by anodization of the base plate on which the separation layer is to be formed, or ion implantation into the base plate. The ions implanted into the base plate include hydrogen ions, ions of rare gases such as helium, neon, krypton, and xenon, singly or in combination. The ion implantation may be conducted either by usual ion implantation technique or by plasma ion implantation technique.

Separation layer 7 is shown to be formed on supporting base plate 8 in first base plate 9 schematically in FIGS. 3A to 3B. However, supporting base plate may be omitted, or supporting base plate 8 itself may have the same structure as the separation layer.

Single crystal semiconductor layer 4 can be formed on separation layer 7 by CVD including low pressure CVD, plasma CVD, photo-assisted CVD, and MOCVD (metal-organic CVD); a sputtering system (including bias sputtering); a molecular beam epitaxial growth; a liquid-phase growth; or the like.

The separation at separation layer 7, or removal of separation layer 7 is described below.

The methods of the separation is classified roughly into two. In one method of the separation, the multiple layer structure is heated from the outside, or irradiated with light to accumulate the energy for separation within the multiple layer structure. Specifically, the layer having fine micro bubbles or fine latent micro bubbles formed by implanting ions such as hydrogen ions, rare gas ions, and nitrogen ions into the first base plate, namely separation layer 7, decreases its density with increase of the fine voids by receiving the thermal energy, whereby the multiple layer structure is separated at the layer. This is the method of generating the separation energy in the interior of the multiple layer structure. Otherwise, by heating treatment, the separation layer and/or the vicinity thereof is oxidized from the lateral face side to cause separation by utilizing stress produced by oxidation film growth.

In another method of the separation, the energy for the separation is applied directly to the multiple layer structure from the outside. The method includes separation by inserting a wedge to the lateral edge face of the multiple layer structure, separation by blowing a fluid composed of a liquid containing water and an etching solution and/or a gas such as air, nitrogen, and carbon dioxide, separation by breaking the separation layer by application of pressing forces in opposite directions onto the front face and the back face of the multiple layer structure, separation by breaking the separation layer by application of shearing force to the lateral face of the multiple layer structure, separation by slicing with an inner blade or a wire saw, separation by breaking the separation layer by application of supersonic vibration. Two or more of the above method may be combinedly employed.

The etchant for removing separation layer 7 by etching includes aqueous KOH solutions, aqueous NaOH solutions, and mixed solutions containing hydrofluoric acid, nitric acid, and acetic acid.

The SOI substrate having insulation layer 3 formed on first base plate 9, not on second semiconductor base plate 2, can be reclaimed substantially without loss of the thickness of the second semiconductor base plate 2.

An SOI substrate which is formed by the aforementioned bonding method, after the reclamation, the bared surface of the second silicon base plate 2 may be a bonding interface between the first silicon base plate and the second silicon base plate. In such a case, the bared bonding face may have residual haze on the bared surface. Here the haze means scattering of reflected light on the surface by fine roughness (cycles of several nanometers) of the surface of the silicon base plate after removal of the oxide film to give white appearance. Namely, the term "haze" means a state that a part of the surface of the silicon base plate is tarnished to turn white. One of the causes of the haze is considered to be the moisture enclosed in the bonding interface during the bonding. In the present invention, the haze can be cleared by hydrogen annealing or CMP of the surface of the reclaimed silicon base plate after the oxide film removal.

FIGS. 4A to 4H illustrates an example of steps of production of an SOI substrate by a bonding method, and reclamation of the second silicon base plate without loss of its thickness substantially.

Figure 4A:
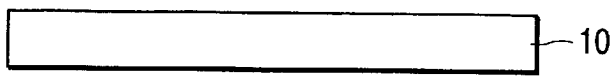
FIGS. 4A, 4B, 4C, 4D, 4E, 4F, 4G and 4H are schematic sectional views illustrating the steps of preparing an SOI substrate by a bonding method and the steps of reclamation of an SOI substrate according to the present invention.
Figure 4B:
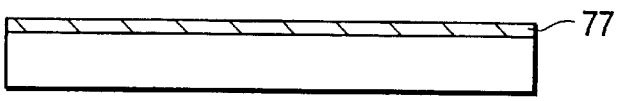
Figure 4C:
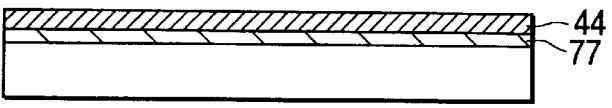
Figure 4D:
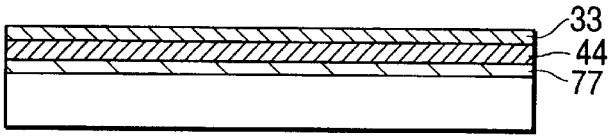
Figure 4E:
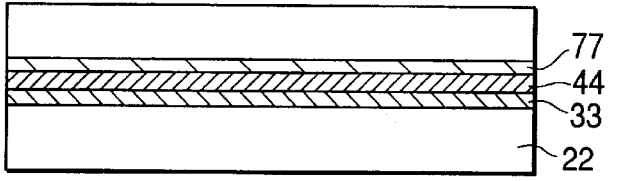
Figure 4F:
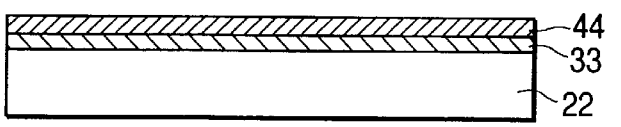
Figure 4G:
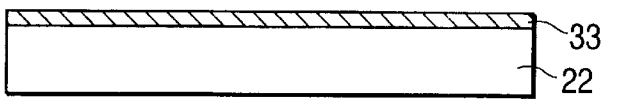

An SOI substrate is produced through steps of providing a single crystal silicon base plate (FIG. 4A), forming porous silicon layer 77 on the main surface of single crystal silicon base plate 10 (FIG. 4B), forming single crystal silicon layer 44 on porous silicon layer 77 (FIG. 4C), forming thermal oxidation film 33 on the surface of single crystal silicon layer 44 (FIG. 4D), bonding second single crystal silicon base plate 22 thereon to obtain a multiple layer structure (FIG. 4E), and separating the multiple layer structure at porous silicon layer 77 or removing porous silicon layer 77 to obtain an SOI substrate (FIG. 4F).

Figure 4H:

From the SOI substrate formed above, single crystal silicon layer 44 is removed in the first removal step of the present invention (FIG. 4G), and then thermal oxidation film 33 is removed selectively (FIG. 4H).

In the above process, second single crystal silicon base plate 22 can be reclaimed without decreasing the thickness thereof from the SOI substrate. Naturally, the aforementioned haze can be further reduced by surface treatment.

Figure 5A:
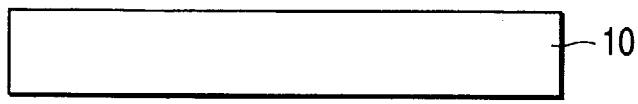
FIGS. 5A, 5B, 5C, 5D, 5E, 5F, and 5G are schematic sectional views illustrating the steps of preparing an SOI substrate by a bonding method and the steps of reclaiming an SOI substrate according to the present invention.
Figure 5B:
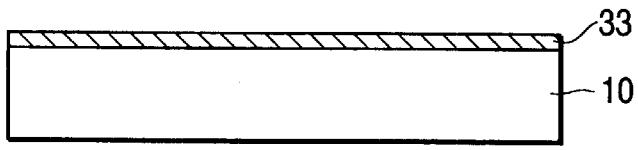
Figure 5C:
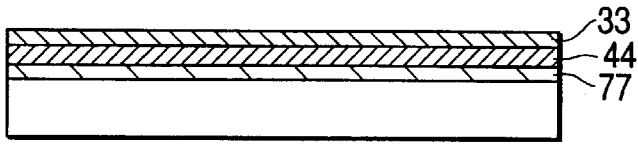
Figure 5D:
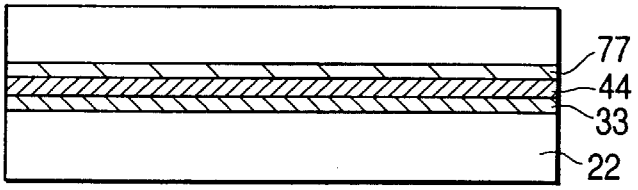
Figure 5E:
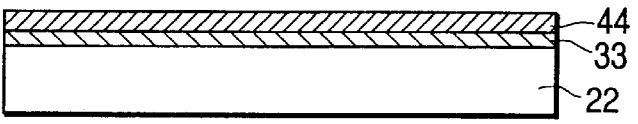
Figure 5F:
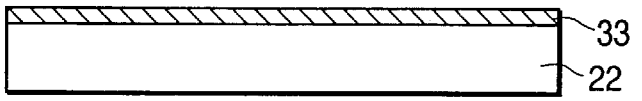
Figure 5G:
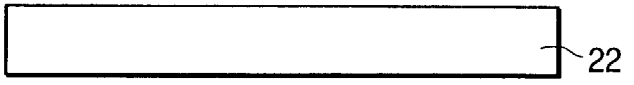

In another process, from an SOI substrate prepared as below, the second silicon base plate can be reclaimed without loss of the thickness thereof substantially. The process comprising steps of providing single crystal silicon base plate 10 (FIG. 5A), forming thermal oxidation film 33 on the surface of the base plate 10 (FIG. 5B), forming separation layer 77 (for defining the separation position) by implanting rare gas ions or hydrogen ions into the base plate having thermal oxidation film 33 formed thereon (FIG. 5C), forming a multiple layer structure by bonding it to second single crystal silicon base plate 22 (FIG. 5D), forming an SOI substrate by separation at separation layer 77 (FIG. 5E), removing single crystal silicon layer 44 by the first removal step of the present invention (FIG. 5F), and removing thermal oxidation film 33 selectively in the second removal step of the present invention (FIG. 5G). Single crystal silicon layer 44 is a portion of base plate 10 into which portion the base plate 10 was partitioned with separation layer 77. In the above process, second single crystal silicon base plate 22 can be reclaimed substantially without decreasing the thickness thereof from the SOI substrate. For further surface flatness, surface treatment may be conducted.

Embodiment 1

A first embodiment of the present invention is described by reference to FIGS. 2A to 2C. SOI substrate 1 is provided which comprises semiconductor base plate 2 to be reclaimed and single crystal semiconductor layer 4 formed thereon with interposition of insulation layer 3 (FIG. 2A). Single crystal semiconductor layer 4 constituting the surface layer of SOI substrate 1 is removed by etching (FIG. 2B). Then Insulation layer 3 is removed selectively by etching (FIG. 2C) to obtain reclaimed base plate 5.

Embodiment 2

A second embodiment of the present invention is described by reference to FIGS. 2A to 2D. In the same manner as in Embodiment 1, single crystal semiconductor layer 4 and insulation layer 3 are removed from SOI substrate 1 respectively by etching (FIGS. 2A to 2C). Thereafter, the surface of reclaimed base plate 5 having been bared by the removal of insulation layer 3 by selective etching is flattened by hydrogen-annealing (FIG. 2D) to obtain a reclaimed SOI base plate.

Embodiment 3

A third embodiment of the present invention is described by reference to FIGS. 2A to 2D. In the same manner as in Embodiment 1, single crystal semiconductor layer 4 and insulation layer 3 are removed from SOI substrate 1 respectively by etching (FIGS. 2A to 2C). Thereafter, the surface of reclaimed base plate 5 bared by removal of insulation layer 3 by selective etching is flattened by surface polishing (FIG. 2D) to obtain a reclaimed SOI base plate.

Embodiment 4

A fourth embodiment of the present invention is described by reference to FIGS. 2A to 2C. SOI substrate 1 is provided which comprises semiconductor base plate 2 to be reclaimed and single crystal semiconductor layer 4 formed thereon with interposition of insulation layer 3 (FIG. 2A). Single crystal semiconductor layer 4 constituting the surface layer of SOI substrate 1 is removed by polishing (FIG. 2B). Then Insulation layer 3 is removed selectively by etching (FIG. 2C) to obtain reclaimed base plate 5.

Embodiment 5

A fifth embodiment of the present invention is described by reference to FIGS. 2A to 2D. In the same manner as in Embodiment 4, from SOI substrate 1, single crystal semiconductor layer 4 is removed by polishing, and insulation layer 3 is removed selectively by etching (FIGS. 2A to 2C). Thereafter, the surface of reclaimed base plate 5 having been bared by removal of insulation layer 3 by selective etching is flattened by hydrogen-annealing (FIG. 2D) to obtain a reclaimed SOI base plate.

Embodiment 6

A sixth embodiment of the present invention is described by reference to FIGS. 2A to 2D. In the same manner as in Embodiment 4, from SOI substrate 1, single crystal semiconductor layer 4 is removed by polishing, and insulation layer 3 are removed selectively by etching (FIGS. 2A to 2C). Thereafter, the surface of reclaimed base plate 5 bared by removal of insulation layer 3 by selective etching is flattened by surface-polishing (FIG. 2D) to obtain a reclaimed SOI base plate.

Embodiment 7

Figure 6A:
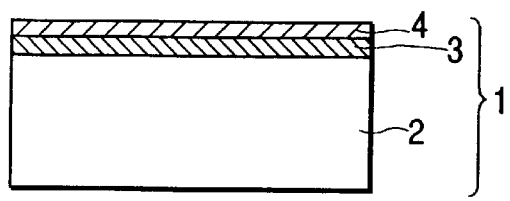
FIGS. 6A, 6B, and 6C are schematic sectional views illustrating the steps of reclaiming an SOI substrate according to the present invention.
Figure 6B:
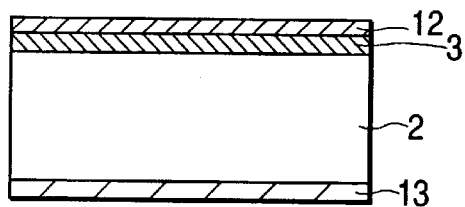
Figure 6C:
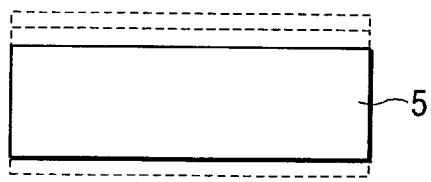

A seventh embodiment of the present invention is described by reference to FIGS. 6A to 6C. SOI substrate 1 is provided which is the object of the reclamation (FIG. 6A). SOI substrate 1 comprises semiconductor base plate 2, and single crystal semiconductor layer 4 formed thereon with interposition of first insulation layer 3. Single crystal semiconductor layer 4 is oxidized into second insulation layer 12 (FIG. 6B). In the case where second insulation layer 12 is formed by thermal oxidation, back side insulation film 13 is formed also on the back face of semiconductor base plate 2. Second insulation layer 12, and first insulation film 3 are removed by etching. Back insulation layer 13, if it is formed, is simultaneously removed. Thereby, reclaimed silicon base plate 5 is obtained. In particular, in the case where first insulation layer 3 and second insulation layer 12 are comprised of the same material (e.g., silicon oxide), single crystal semiconductor layer 4 and first insulation layer 3 can be removed simultaneously in one step. Thereby the etching step is simplified with less contamination by the etching chemical in the base plate reclamation process.

EXAMPLE 1

An SOI substrate of 400 $\mu$m thick was provided which is comprised of a silicon base plate, and a single crystal silicon layer of 0.2 $\mu$m thick formed thereon with interposition of a silicon oxide layer of 0.2 $\mu$m thick.

Firstly the single crystal silicon layer was removed by a silicon etching process. The etching was conducted by wet etching with aqueous tetramethylammonium hydroxide solution (0.5% by weight). This aqueous solution etches silicon at an etching rate of 0.2 to 0.3 $\mu$m/min, but etches silicon oxide at a rate as low as 3 Å/min. Therefore, the etching stopped automatically when the single crystal silicon layer came to be completely etched. In the wet etching, usually the back face of the silicon base plate is also brought into contact with the etchant, and the etching proceeds at the back face. However, even when 50% excess etching is conducted for the single crystal silicon layer of 0.2 $\mu$m thick, the etching of the back face of silicon base plate is about 0.3 $\mu$m thick. Naturally, the back face may be coated by a photoresist spin coating or the like method to prevent the back face etching.

Then the silicon oxide layer was removed by a silicon oxide etching process. The etching was conducted by wet etching with an aqueous hydrofluoric acid solution. This aqueous solution etches silicon oxide rapidly, but is almost inert to silicon. Therefore, the etching stopped automatically when the silicon oxide layer came to be completely etched, not causing loss of the thickness of the silicon base plate. Thus, the silicon base plate was reclaimed.

Thereafter, the surface of the reclaimed silicon base plate was flattened by hydrogen annealing under the annealing conditions of the gas atmosphere of 100% hydrogen, the heating temperature of 1100° C., the heating time of about 4 hours. In the annealing under the above conditions, the loss of the thickness of the reclaimed silicon was negligible (about 0.001 $\mu$m).

A reclaimed silicon base plate having excellent surface flatness was obtained through the above steps. The loss of the plate thickness through the above steps was 0.2 $\mu$m of the silicon oxide layer, 0.2 $\mu$m of the single crystal silicon layer, and 0.3 $\mu$m of back side etching in the silicon etching step, the total being 0.7 $\mu$m, which corresponds to about 0.2% of the thickness of original SOI substrate.

Incidentally, etching can occur at the edge face of the silicon base plate similarly as the back face etching to cause dimension change in the plane direction of the silicon base plate, which is extremely small and is negligible in comparison with the size of the silicon base plate (e.g., 200 mm in diameter).

COMPARATIVE EXAMPLE 1

Figure 7A:
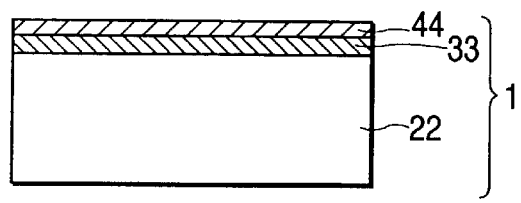
FIGS. 7A, 7B, and 7C are schematic sectional views illustrating the steps of reclaiming an SOI substrate of Comparative Example.
Figure 7B:
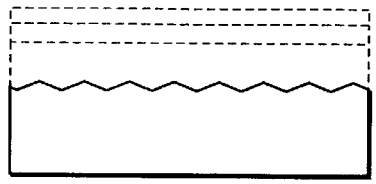
Figure 7C:
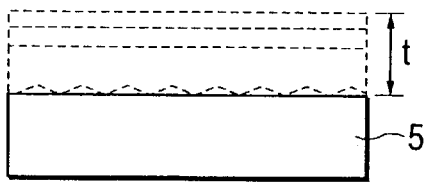

The same SOI substrate as in Example 1 was provided (FIG. 7A). This SOI substrate 1 was subjected to grinding (FIG. 7B) and polishing (FIG. 7C) to remove insulation layer 33, single crystal silicon layer 44, and a part of silicon base plate 22 to obtain reclaimed silicon base plate 5. In the above removal treatment, the removed layer thickness t was about 25 $\mu$m. In the above treatment, a part of silicon base plate 22 was removed to cancel the defects such as distortion caused by the treatment and crystal dislocation on the surface of silicon substrate 22. In the above reclamation treatment the thickness of silicon base plate 22 decreased by about 6%.

Generally, in a process of SOI substrate production or in a production line of semiconductor devices, allowable thickness range of the silicon base plate is limited by the production equipment. When the allowable thickness of the silicon base plate is not less than 95% of the original thickness, the above reclaimed silicon base plate is not in the allowable thickness range, and is not reusable. Even when the allowable thickness thereof is not less than 90% of the original thickness, the above reclaimed silicon base plate may get out of the allowable limit after two or more times of repeated reclamation, disadvantageously.

From the results above, the SOI base plate can be reclaimed with extremely little loss of the thickness of the silicon base plate according to the present invention.

COMPARATIVE EXAMPLE 2

Figure 8A:
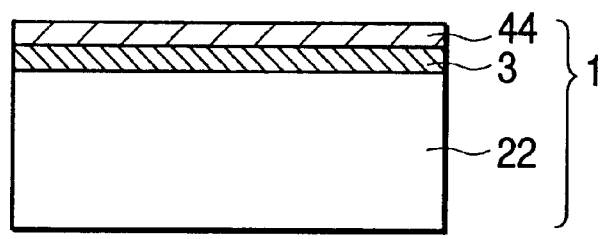
FIGS. 8A, and 8B are schematic sectional views illustrating variation of the amount of grinding or polishing in the reclamation process.
Figure 8B:
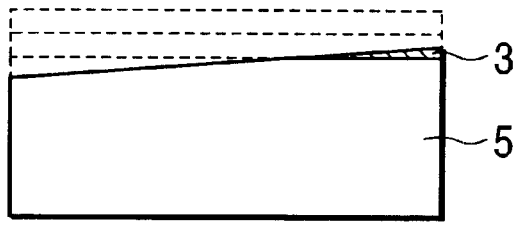

A case is considered where insulation layer 3 is removed by polishing or grinding. SOI substrate 1 comprising silicon base plate 22, and single crystal silicon layer 44 is provided as shown in FIG. 8A. To reclaim the base plate, insulation layer 3 is removed by polishing or grinding. The variation of the amount of the polishing or the grinding may cause nonuniformity of the thickness of reclaimed silicon base plate as shown in FIG. 8B.

In the present invention, insulation layer 3 can be selectively removed without causing the variation of the thickness of the reclaimed base plate differently from this Comparative Example 2.

EXAMPLE 2

An SOI substrate was provided which was the same as that in Example 1. The single crystal silicon layer was removed by etching in the same manner as in Example 1. Then the silicon oxide layer was removed by selective etching with BHF as the etchant. The bared surface of the silicon base plate was subjected to chemical-mechanical polishing (CMP) with a dispersion of colloidal silica in a sodium hydroxide solution as the polishing agent. Thereby the surface of the base plate was flattened with the thickness decrease t of 10 $\mu$m.

COMPARATIVE EXAMPLE 3

Figure 9A:
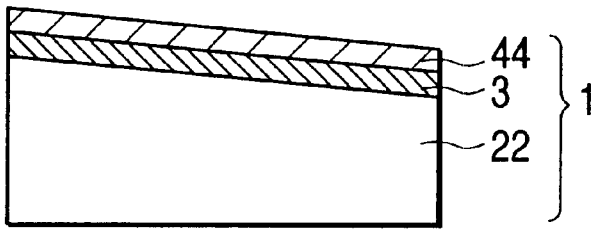
FIGS. 9A, and 9B are schematic sectional views illustrating variation of the thickness of the reclaimed substrate in the reclamation process.
Figure 9B:
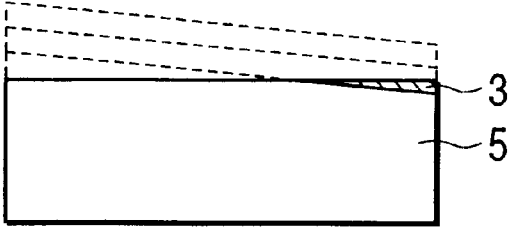
Figure 10A:
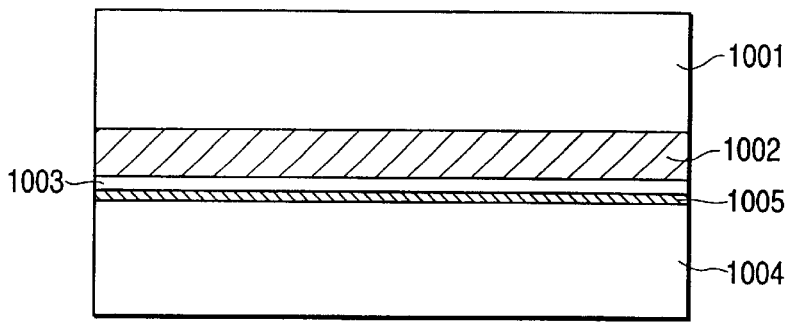
FIGS. 10A, 10B, and 10C are schematic sectional views illustrating reuse of a substrate having been used for preparation of SOI substrate by bonding.
Figure 10B:
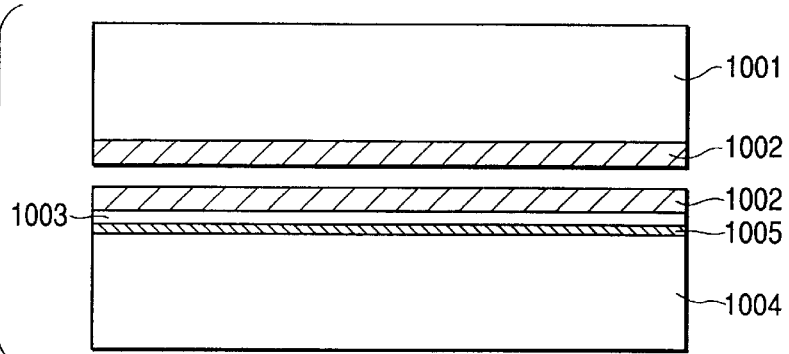
Figure 10C:
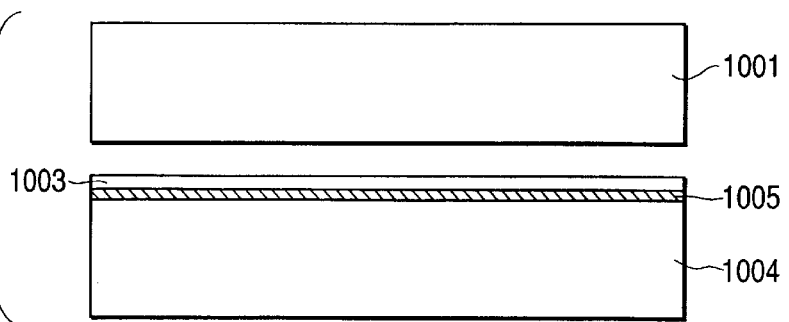

A phenomenon is explained which occurs in removal of silicon layer 44 and insulation layer 3 by polishing, by reference to FIGS. 9A to 9B.

In selected removal of insulation layer 3 and silicon layer 44 with strict control of the amount of the polishing, the problem arises as below. FIG. 9A shows a state of polishing of silicon base plate 22 having variation in the thickness. When the thickness variation of silicon base plate 22 before the polishing is larger than the sum of the thicknesses of insulation layer 3 and silicon layer 44, there are formed a region where the surface portion of silicon base plate 22 is removed by polishing, and another region where insulation layer 3 is partly left unpolished. This is caused because the back face of silicon base plate 22 is employed as the reference level of working in usual polishing. Insulation layer 3 left unpolished causes inconvenience in the reuse, whereas large polishing amount to avoid the problem increases the loss of thickness of silicon base plate 22.

On the other hand in the present invention, insulation layer 3 is removed selectively by etching, and subsequently polished by CMP, whereby insulation layer 3 is removed completely and the loss of the layer thickness in reclaiming silicon base plate 5 is minimized without variation of the thickness.

EXAMPLE 3

An SOI substrate of 400 $\mu$m thick was provided which is comprised of a silicon base plate, and a single crystal silicon layer of 0.2 $\mu$m thick formed thereon with interposition of a silicon oxide layer of 0.2 $\mu$m thick.

To reclaim this SOI substrate, firstly the single crystal silicon layer was removed by CMP. The polishing agent employed was an abrasion grain dispersion composed of a mixture of a fine abrasion grain powder of silicon oxide and an alkali such as sodium hydroxide. SOI substrate 1 was fixed at the back face by a wax onto a glass plate. This plate was placed with the bonded SOI face directed downward on a level block having a polishing cloth sheet bonded thereon. The plate and the level block were rotated relatively with application of a load between the plate and the level block with feeding of the abrasion grain dispersion at a prescribed rate to conduct CMP process. This polishing process utilizes combination of a chemical action and a mechanical action. A foreign matter which is not removable chemically (a residue formed in SOI production) on the surface of the single crystal silicon layer can be removed mechanically. Since the rate of polishing of silicon oxide is extremely low, the polishing is considered to stop automatically, practically to remove selectively silicon layer.

Next, the silicon oxide layer was removed in the silicon oxide etching step. The etching was conducted by wet etching with an aqueous buffered hydrofluoric acid solution. Thus a reclaimed silicon base plate was obtained.

The reclaimed silicon base plate after completion of the silicon oxide etching can be reused without further treatment. However, the reclaimed silicon base plate was subjected to hydrogen annealing for further flattening of the surface in a reductive atmosphere containing hydrogen at 1100° C. for one hour.

Consequently, a reclaimed silicon base plate was obtained with excellent surface flatness.

In the case where the SOI substrate is prepared by a bonding method, and the bonding interface is bared by etching of the silicon oxide, a portion of the interface may be hazed. The haze can be decreased or cleared by the hydrogen annealing.

This reclaimed silicon base plate is useful not only as a test wafer or a monitor wafer but also for production of the SOI substrate repeatedly.

EXAMPLE 4

An SOI substrate was provided which was the same as that in Example 3. The single crystal silicon layer was removed by CMP, and the silicon oxide layer was removed by selective etching in the same manner as in Example 3. The resulting reclaimed silicon base plate was subjected to touch polishing for surface flatness. The thickness decrease was 1 $\mu$m.

Through the above steps, a reclaimed silicon base plate was obtained with excellent surface flatness.

In the case where the SOI substrate is prepared by a bonding method, and the bonding interface is bared by etching of the silicon oxide, a portion of the interface may be hazed. The haze can be decreased or cleared by the touch polishing.

This reclaimed silicon base plate is useful not only as a test wafer or a monitor wafer but also for production of the SOI substrate repeatedly.

The thickness loss through the above steps was 0.2 $\mu$m of the silicon oxide layer, 0.2 $\mu$m of the single crystal silicon layer, and the touch polishing loss of 1 $\mu$m, namely 1.4 $\mu$m in total, which corresponded to about 0.35% of the thickness of the original SOI substrate.

The present invention is characterized in that the process of removal of the surface layers of the silicon base plate comprises a polishing step and a subsequent etching step. Thereby, relatively thick layer of the layer structure can be removed selectively in a short time with little loss of the base plate thickness. Furthermore, when no suitable etchant is found for an upper layer of a layer structure comprised of two or more layers, the layers can be removed selectively with little loss of the base plate thickness.

EXAMPLE 5

An SOI substrate of 400 $\mu$m thick was provided which is comprised of a silicon base plate, and a single crystal silicon layer of 0.2 $\mu$m thick formed thereon with interposition of a first silicon oxide of 0.2 $\mu$m thick.

Firstly the single crystal silicon layer was oxidized by thermal oxidation to form a second silicon oxide layer. In the thermal oxidation, the back face of the silicon base plate was also oxidized in the same thickness as the single crystal silicon layer, namely 0.2 $\mu$m to form a back face silicon oxide layer.

Next, the first silicon oxide layer, the second silicon oxide layer, and the back face silicon oxide layer were removed by wet etching in a silicon oxide etching step. The wet etching was conducted with an aqueous solution of BHF (buffered hydrofluoric acid). This aqueous solution etches silicon oxide rapidly, but is almost inert to silicon. Therefore, the etching stopped automatically, when the first silicon oxide layer, the second silicon oxide layer, and the back face silicon oxide layer came to be completely etched, not causing loss of the thickness of the silicon base plate. Thus, the silicon base plate was reclaimed.

The thickness loss through the above steps was 0.2 $\mu$m of the first silicon oxide layer, 0.2 $\mu$m of the single crystal silicon layer, and 0.2 $\mu$m of the back face portion of the silicon base plate, namely 0.6 $\mu$m in total, which corresponded to about 0.15% of the thickness of the original SOI substrate.

Thus a reclaimed base plate and a process for production thereof are provided in which the loss of the thickness of the base plate is decreased, according to this Example. In this process, the silicon layer and the insulation layer can be removed simultaneously in one step, whereby the etching step is simplified. Further, irregular etching of the back face of the silicon base plate is not caused, and contamination by an impurity formed from chemicals is reduced.

According to the present invention, layer portion can be selectively removed from an SOI substrate having a layer structure, so that a base plate can be reclaimed with extremely little loss of the thickness of the base plate.

The reclaimed base plate, according to the present invention, can be reused repeatedly in applications having thickness limitation because of extremely little loss of the thickness in the reclamation. Therefore, the present invention is advantageous from the standpoint of industrial production, resource saving, and environmental protection.

What is claimed is:

1. A process for reclaiming an SOI substrate, comprising:
   a step of providing an SOI substrate having a semiconductor base plate, and a single crystal semiconductor layer formed thereon with interposition of an insulation layer;
   a first removal step for removing the single crystal semiconductor layer;
   a second removal step for removing the insulation layer which has been exposed in the first removal step to bare a surface of the semiconductor base plate; and
   a step of flattening the bared surface of the semiconductor base plate by heat-treating in a reductive atmosphere containing hydrogen the semiconductor base plate, or alternatively, by subjecting the surface to chemical mechanical polishing to flatten the bared surface of the semiconductor base plate,
   wherein the SOI substrate has been fabricated by a bonding method, and the bared surface of the semiconductor base plate has roughness of several nanometers in cycle, the roughness having been generated by the bonding method.

2. A process for reclaiming an SOI substrate according to claim 1, wherein said single crystal semiconductor layer is an epitaxial layer.

3. A process for reclaiming an SOI substrate according to claim 1, wherein said SOI substrate is fabricated by a process comprised of a step of implanting hydrogen ions, nitrogen ions and rare gas ions.

4. A process for producing a reclaimed SOI semiconductor substrate, comprising the steps of:
   bonding a first base plate and a second base plate;
   removing a portion of said first base plate so as to leave a single crystal semiconductor layer and an insulation layer on said second base plate;
   removing said single crystal semiconductor layer so as to leave said insulation layer on said second base plate;
   removing said insulation layer from said second base plate by selective etching; and
   heat-treating in a reductive atmosphere containing hydrogen said second base plate having a bared semiconductor surface which has a roughness of several nanometers in cycle, the roughness having been generated by the bonding method.

* * * * *

UNITED STATES PATENT AND TRADEMARK OFFICE
CERTIFICATE OF CORRECTION

PATENT NO.    : 6,613,676 B1
DATED         : September 2, 2003
INVENTOR(S)   : Takao Yonehara et al.

It is certified that error appears in the above-identified patent and that said Letters Patent is hereby corrected as shown below:

<u>Title page,</u>
Item [57], ABSTRACT,
Line 3, "is reclaimed" should read -- and reclaimed --.

<u>Column 3,</u>
Line 13, "improve" should read -- improves --.

<u>Column 4,</u>
Line 10, "has" should read -- has a --;
Line 12, "a test" should read -- as a test --;
Line 38, "of" (second occurrence) should read -- of a --; and
Lines 41 and 45, "variation" should read -- variations --.

<u>Column 5,</u>
Line 7, "is" should read -- are --;
Line 22, "obtained" should read -- obtain --;
Lines 25 and 47, "include" should read -- includes --; and
Line 60, "srystal" should read -- crystal --.

<u>Column 6,</u>
Line 14, "utilizes" should read -- utilizes a --; and
Line 43, "semiconsuctor" should read -- semiconductor --.

<u>Column 7,</u>
Line 27, "and" should be deleted; and
Line 39, "other" should read -- another --.

<u>Column 8,</u>
Line 22, "is" should read -- are --.

<u>Column 13,</u>
Line 29, "utilizes" should read -- utilizes a --; and
Line 36, "selectively" should read -- selectively the --.

UNITED STATES PATENT AND TRADEMARK OFFICE
CERTIFICATE OF CORRECTION

PATENT NO. : 6,613,676 B1
DATED : September 2, 2003
INVENTOR(S) : Takao Yonehara et al.

It is certified that error appears in the above-identified patent and that said Letters Patent is hereby corrected as shown below:

<u>Column 14,</u>
Line 19, "Thereby," should read -- Thereby, a --; and
Line 63, "layer" should read -- a layer --.

<u>Column 15,</u>
Line 3, "limitation" should read -- limitations --.

Signed and Sealed this

Tenth Day of February, 2004

JON W. DUDAS
*Acting Director of the United States Patent and Trademark Office*